(12) United States Patent
Ikeda

(10) Patent No.: US 6,721,137 B1
(45) Date of Patent: Apr. 13, 2004

(54) MAGNETORESISTANCE DEVICE

(75) Inventor: Takashi Ikeda, Nagoya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/549,232

(22) Filed: Apr. 13, 2000

(30) Foreign Application Priority Data

Apr. 16, 1999 (JP) .......................................... 11-109571

(51) Int. Cl.$^7$ .......................... G11B 5/127; B32B 7/02; B32B 5/16; B32B 15/04; B32B 9/00

(52) U.S. Cl. ........................ 360/313; 360/314; 360/324; 428/212; 428/216; 428/328; 428/469; 428/692

(58) Field of Search ................................ 428/212, 328, 428/469, 216, 692; 360/313, 314, 324

(56) References Cited

U.S. PATENT DOCUMENTS

| | | | |
|---|---|---|---|
| 5,595,830 A | * 1/1997 | Daughton | 428/611 |
| 5,652,054 A | * 7/1997 | Kikitsu et al. | 428/328 |
| 5,726,837 A | * 3/1998 | Nakatani et al. | 360/113 |
| 5,729,410 A | * 3/1998 | Fontana, Jr. et al. | 360/113 |
| 6,104,632 A | * 8/2000 | Nishimura | 365/158 |
| 6,219,275 B1 | 4/2001 | Nishimura | 365/173 |

OTHER PUBLICATIONS

Mutsuko Jimbo, et al., "Giant Magnetoresistance In Soft Magnetic NiFeCo/Cu Multilayers With Various Buffer Layers", Journal of Magnetism and Magnetic Materials 126 (1993), pp. 422–424.

V.O. Vas'kovskij, et al., "Amorphous Gadolinium–Cobalt Films With In–plane Anisotropy For Magnetoresistive Sandwiches", Journal of Magnetism and Magnetic Materials 156 (1996), pp. 291–292.

European Search Report Ref. No. 2719130 (Feb. 6, 2001).

* cited by examiner

Primary Examiner—Cynthia H. Kelly
Assistant Examiner—L. Ferguson
(74) Attorney, Agent, or Firm—Fitzpatrick, Cella, Harper & Scinto

(57) ABSTRACT

A magnetoresistance device having a relatively high magnetoresistance ratio enables scale-down and low-current driving, and reduces deterioration of recording storage performance. The magnetoresistance device includes a substrate and a multi-layer film having a first magnetic layer, a second magnetic layer, a non-magnetic layer, a third magnetic layer and a fourth magnetic layer which are superposed on the substrate in this order. The first magnetic layer is exchange-coupled with the second magnetic layer, and the third magnetic layer is exchange coupled with the fourth magnetic layer. The first magnetic layer and the fourth magnetic layer have a magnetic anisotropy in the film-plane normal direction.

11 Claims, 3 Drawing Sheets

↑ MAGNETIZATION OF TRANSITION METAL
↓ MAGNETIZATION OF RARE EARTH ELEMENT
⇑ COMBINED MAGNETIZATION

MAGNETORESISTANCE DEVICE

BACKGROUND OF THE INVENTION

1. Field of the Invention

This invention relates to a magnetoresistance device, and more particularly to a magnetoresistance device that enables scale-down.

2. Related Background Art

Magnetoresistance devices are used in reproducing heads of hard-disk drives at present, and have become indispensable to hard disks having a high recording density. Such devices are also used as sensors and besides are studied on their application to solid-state memory devices.

Anisotropic magnetoresistance devices used in the reproducing heads are basically ferromagnetic films having in-plane magnetic anisotropy, and have a circuit that flows electric currents in the in-plane direction of the ferromagnetic film and a circuit that detects changes in resistance of the ferromagnetic film.

FIG. 1 illustrates the principle of anisotropic magnetoresistance effect. An electric current I flows in the easy-magnetization direction. A ferromagnetic film 1 is provided so that a magnetic field H is applied in the in-plane hard-magnetization direction. A resistivity ρ when the angle at which magnetization M and electric current falls in θ can be represented by an equation:

$$\rho = \rho_\parallel \cdot \cos 2\theta + \rho_\perp \cdot \sin 2\theta$$

wherein $\rho_\parallel$ is a resistivity in the case where the magnetization direction is parallel to the direction of electric current, and $\rho_\perp$ is a resistivity in the case where the magnetization direction is perpendicular to the direction of electric current.

As can be seen from this equation, the resistance of the ferromagnetic film 1 depends on an angle which the direction of the electric current flowing therethrough and the direction of the magnetization make. In the reproducing heads, the magnetization direction of the ferromagnetic film changes depending on floating magnetic fields from the hard-disk, and an amount of its change is detected as an amount of change in resistance.

FIG. 2 shows magnetization directions and a change in resistivity of a magnetoresistance device used as a memory. The case where the magnetization is rightward is regarded as "0", and the case where the magnetization is leftward, as "1", where a rightward magnetic field greater than the coercivity of the ferromagnetic film is applied at the time of detection. In this case, the magnetization direction of a ferromagnetic film where "0" has been recorded does not change, but the magnetization direction of a ferromagnetic film where "1" has been recorded reverses. When magnetization reverses, the magnetization inclines to the direction of electric currents, hence the resistivity changes as stated above. Thus, "0" is detected when there in no change in resistivity, and "1" is detected when there is a change.

On the basis of such a principle as mentioned above, in the recording or detection in conventional magnetoresistance effect type memory devices, conductor wires 31 and 32 are provided at the top and bottom of a ferromagnetic film 40 as shown in FIG. 3, and electric currents are flowed through them, whereby a magnetic field is applied to the ferromagnetic film in-plane.

The magnitudes of electric currents to be flowed through the top and bottom conductor wires are so determined that the magnetization of ferromagnetic film 40 positioned at the part where the conductor wires cross does not reverse when only the magnetic field generated from one-side conductor wire is present but the magnetization reverses when electric currents are simultaneously flowed through the both wires. The direction of a magnetic field to be applied at the time of recording depends on the direction of an electric current flowed through the conductor wire provided in the direction perpendicular to the magnetic anisotropy of ferromagnetic film 40.

The ferromagnetic films used as magnetoresistance devices are ferromagnetic materials formed of Ni, Fe or Co or an alloy of any of these and have an in-plane magnetic anisotropy. The induction of such an in-plane magnetic anisotropy is commonly accomplished by applying a magnetic field in the direction where a ferromagnetic film is made to have a magnetic anisotropy during its formation.

Now, when data having a vast volume as exemplified by recorded voices or sounds and recorded images are handled in, e.g., mobile information appliances, the data are recorded in disks or tapes. Such information appliances, however, require drives and hence require power sources having a large capacity. Since such drives (e.g., a motor) and large-capacity power sources are set in, it has been difficult to make the appliances light-weight.

In addition, in the case of mobile information appliances whose recording mediums are solid-state memories, any solid-state memories made to have a sufficiently high recording density have not been materialized, where only data having a small volume can be handled. As a reason therefor, this is due to the problem that, although the scale-down of ferromagnetic films is required in order to materialize magnetoresistance memories having a high recording density, the demagnetizing field increases with a decrease in size of the ferromagnetic film in its easy-magnetization axis direction and hence the magnetization becomes unstable, resulting in a poor recording storage performance of memory devices.

Accordingly, an attempt is proposed in which the magnetic anisotropy of a ferromagnetic film of a magnetoresistance memory is directed to the direction perpendicular to its film plane (film-plane normal direction) to make its recording density higher.

However, materializing magnetoresistance memories of this type has involved the following problems.

Taking account of their setting in mobile information terminal appliances, it is desirable for them to be operable at a low electric current. Accordingly, materials having a small coercivity or a small magnetization-saturating magnetic field are desirable as ferromagnetic film materials. Such materials may include rare-earth/transition metal alloys, in particular, materials making use of gadolinium as the rare-earth metal.

However, in rare-earth/transition metal alloy films, the mean free path of electrons is as very short as several angstroms. Hence, in magnetoresistance devices of a spin scattering type making use of such films, it is difficult to obtain a high magnetoresistance ratio.

Spin tunnel type magnetoresistance devices making use of a rare-earth/transition metal alloy also show a tendency to decrease in the rate of spin polarization when rare-earth metal atoms are present at the interface between the film and a non-magnetic layer.

Moreover, since rare-earth metals tend to be oxidized, there is a problem that, when oxides are formed in contact therewith, the rare-earth metals are oxidized to cause a lowering of magnetic characteristics or the magnetoresistance effect.

SUMMARY OF THE INVENTION

Taking account of the above problems, an object of the present invention is to provide a magnetoresistance device having a relatively high magnetoresistance ratio, also enabling scale-down and low-current driving, and may cause less deterioration of recording storage performance.

To achieve the above object, the present invention provides a magnetoresistance device comprising;
- a multi-layer film having a first magnetic layer, a second magnetic layer, a non-magnetic layer, a third magnetic layer and a fourth magnetic layer which are superposed in this order;
- wherein the first magnetic layer stands exchange-coupled with the second magnetic layer, and the third magnetic layer exchange-coupled with the fourth magnetic layer, and both the first magnetic layer and the fourth magnetic layer have a magnetic anisotropy in a normal direction of a plane of the film.

Details and advantages of the device will become apparent from the description of embodiments given later.

DESCRIPTION OF THE PREFERRED EMBODIMENTS

Figure 1:
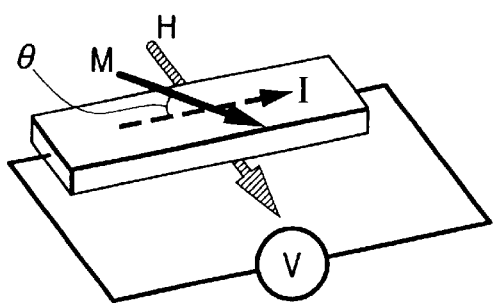
FIG. 1 illustrates the principle of anisotropic magnetoresistance effect.
Figure 2:
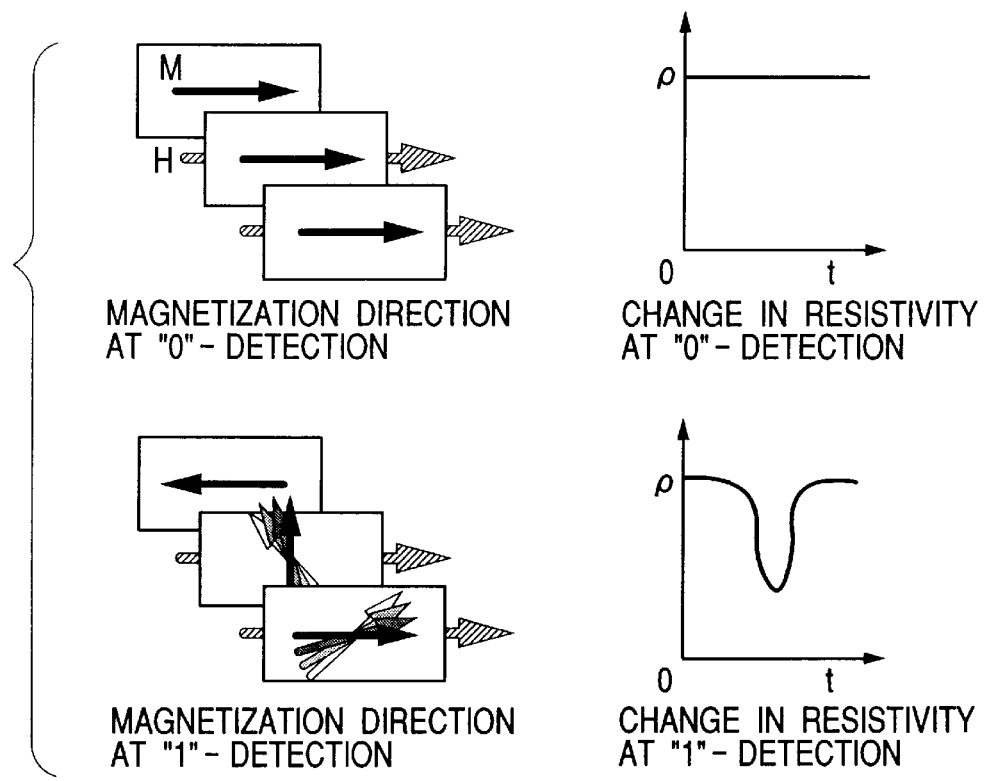
FIG. 2 illustrates magnetization directions and changes in resistivity of a conventional magnetoresistance device.
Figure 3:
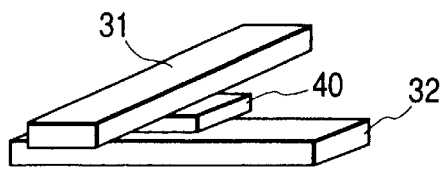
FIG. 3 illustrates the disposition of conductor wires for applying a magnetic field and a magnetic film in a conventional magnetoresistance device.
Figure 4:
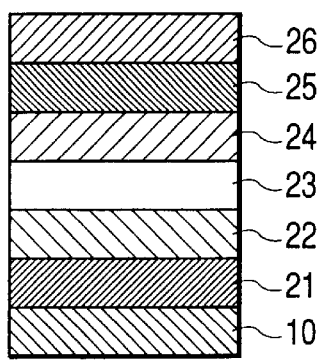
FIG. 4 illustrates the layer configuration of the magnetoresistance device of the present invention.

An example of the layer configuration of the magnetoresistance device of the present invention is shown in FIG. 4. It has a layer configuration that a first magnetic layer 21, a second magnetic layer 22, a non-magnetic layer 23, a third magnetic layer 24, a fourth magnetic layer 25 and a protective layer 26 are superposed in this order on a substrate 10.

As the substrate 10, usable are, e.g., a silicon substrate and a glass substrate.

In the first and fourth magnetic layers, a magnetic material showing a vertical magnetic anisotropy is used. The first magnetic layer stands exchange-coupled with the second magnetic layer, and the third magnetic layer with the fourth magnetic layer.

The second magnetic layer and the third magnetic layer may have either of a magnetic anisotropy in the film in-plane direction and a magnetic anisotropy in the film-plane normal direction. In the case when they have a magnetic anisotropy in the film in-plane direction, their magnetization directions are parallel to the magnetization directions of perpendicular-magnetizing films standing exchange-coupled with these layers, and these layer are in a state hardly magnetizable in the film in-plane direction. Namely, keeping perpendicular the magnetization directions of the second magnetic layer and the third magnetic layer depends on the first magnetic layer and the fourth magnetic layer. This enables wide-range selection of materials usable in the second-magnetic layer and the third magnetic layer.

In order to detect the magnetoresistance ratio, it is also necessary to establish a state where the magnetization direction of the second magnetic layer is antiparallel to the magnetization direction of the third magnetic layer. Accordingly, when transition metals are used as materials for the second magnetic layer and the third magnetic layer, the magnitude of coercivity of the second magnetic layer when it stands exchange-coupled with the first magnetic layer must be different from the magnitude of coercivity of the third magnetic layer when it stands exchange-coupled with the fourth magnetic layer.

In the second magnetic layer and the third magnetic layer, a material is used which is less oxidizable than rare-earth metals and has a high magnetoresistance ratio (spin polarization ratio). Such a magnetic-layer material may include Fe, $CoCr_{20}$, Co, CoFe, Ni and NiFe.

With regard to the non-magnetic layer, it may be formed of either of, e.g., a conductor such as Cu and an insulator such as aluminum oxide.

The protective layer may preferably be formed of a material containing no oxygen atom, including, e.g., platinum and SiN.

The layer configuration as described above makes it possible to obtain a magnetoresistance device very small in size that is operable at a small applied magnetic field and has a relatively high magnetoresistance ratio.

Under conditions such that any mutual action of magnetic layers provided above and below the non-magnetic layer is not taken into account, the magnetoresistance ratio increases with a decrease in thickness of the non-magnetic layer in the case of spin-scattering type magnetoresistance devices.

In practice, however, the magnetostatic coupling force of the magnetic layers provided above and below a non-magnetic layer becomes stronger with a decrease in thickness of the non-magnetic layer, and any antiparallel state of magnetization can not be obtained, resulting in a decrease in the magnetoresistance ratio on the contrary. In the case of spin tunnel type magnetoresistance devices, too, the magnetization of magnetic atoms at the interface between the second magnetic layer and the non-magnetic layer or between the third magnetic layer and the non-magnetic layer and in the vicinity thereof may deviate from the desired direction, resulting in a low magnetoresistance ratio.

As a method of making the magnetostatic coupling force small, the magnetization of the magnetic layers provided above and below the non-magnetic layer may be made small. Accordingly, in the magnetoresistance device of the present invention, the combined magnetization of the first magnetic layer and the magnetization of the second magnetic layer may preferably be in magnitudes substantially equal to each other and be in directions antiparallel to each other. Also the magnetization of the third magnetic layer and the combined magnetization of the fourth magnetic layer may preferably be in magnitudes substantially equal to each other and be in directions antiparallel to each other. If, however, the combined magnetization of the first magnetic layer and the magnetization of the second magnetic layer, and the magnetization of the third magnetic layer and the combined magnetization of the forth magnetic layer are entirely equal to each other respectively, any recording in the respective magnetic layers can not be performed. Hence, it is preferable to set the combined magnetization of the first magnetic layer a little larger than the magnetization of the second magnetic layer and also to set the combined magnetization of the fourth magnetic layer a little larger than the magnetization of the third magnetic layer, or vice versa. It is also preferable to adjust the exchange-coupling force between both layers so as not to produce any domain wall between the first magnetic layer and the second magnetic layer and between the third magnetic layer and the fourth magnetic layer.

Figure 5:
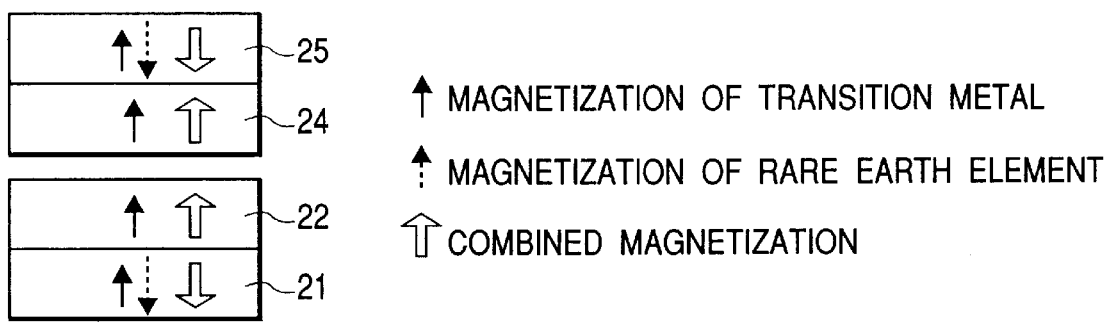
FIG. 5 illustrates magnetization directions of the respective magnetic layers in the magnetoresistance device of the present invention.

For example, transition metals are used in the second magnetic layer and the third magnetic layer, and rare-earth secondary-lattice predominantly magnetizable ferrimagnetic alloys comprised of a rare-earth metal and a transition metal are used in the first magnetic layer and the fourth magnetic layer. Since the first magnetic layer stands exchange-coupled with the second magnetic layer and the third magnetic layer with the fourth magnetic layer, as shown in FIG. 5 the magnetization of the transition metal in the first magnetic layer is parallel to the magnetization of the transition metal in the second magnetic layer, and the magnetization of the rare-earth metal in the first magnetic layer is antiparallel to the magnetization of the transition metal in the second magnetic layer. The like relationship is established also in the third magnetic layer and the fourth magnetic layer. Hence, the compositions of the first magnetic layer and the fourth magnetic layer or the layer thickness of the respective magnetic layers may be adjusted so that the magnitude of total magnetization of transition metals in the first magnetic layer and second magnetic layer (likewise in the third magnetic layer and fourth magnetic layer) may be made substantially equal to the magnitude of magnetization of rare-earth metals in those layers, thus the apparent magnitude of magnetization of the respective exchange-coupled films can be made small. As the result, the magnetostatic coupling force acting on the magnetic layers provided above and below the non-magnetic layer can be made small.

How the first magnetic layer of the present invention operates when used as a memory device will be described below.

An exchange-coupled film of the first magnetic layer and second magnetic layer is set as a memory layer (a layer in which information is accumulated in accordance with the magnetization directions) and an exchange-coupled film of the third magnetic layer and fourth magnetic layer is set as a detecting layer. The memory layer has a coercivity larger than that of the detecting layer.

Figure 6:
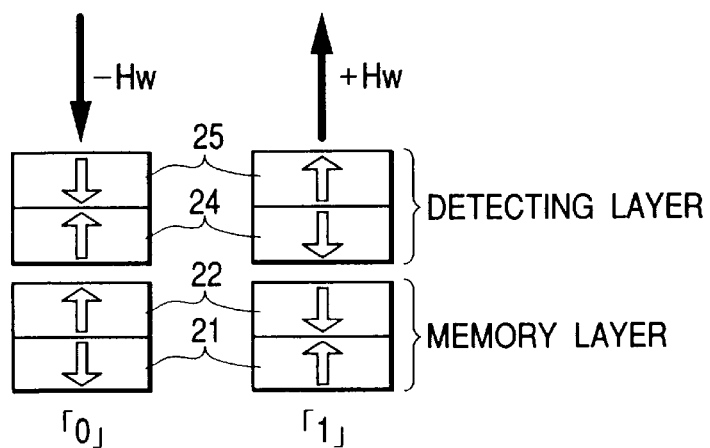
FIG. 6 illustrates recording magnetic fields and magnetization directions at the time of recording in the magnetoresistance device of the present invention.

As shown in FIG. 6, recording is performed by applying a recording magnetic field Hw. The case where the magnetization direction of the memory layer is downward is regarded as "0", and the case where it is upward as "1". However, when in FIG. 6 the rare-earth/transition metal alloys are used in the first magnetic layer and fourth magnetic layer and the transition metals are used in the second magnetic layer and third magnetic layer, the composition of the first magnetic layer and fourth magnetic layer may preferably be transition metal secondary-lattice predominantly magnetizable. Detection is performed by changing the magnetization directions of the detecting layer, utilizing the effect of magnetoresistance. The magnetoresistance is different between the case where the magnetization in the magnetic layers provided above and below the non-magnetic layer is parallel and the case where it is antiparallel. When like materials are used in the magnetic layers, the magnetoresistance is larger in the case where the magnetization is antiparallel than in the case where it is parallel.

The magnetoresistance is detected by detecting changes in voltage when a constant electric current is flowed through the device and the magnetization direction of the detecting layer reverses under application of a magnetic field at a constant intensity. The electric current is flowed in the film-plane normal (vertical) direction in the case of the spin tunnel type.

Figure 7:
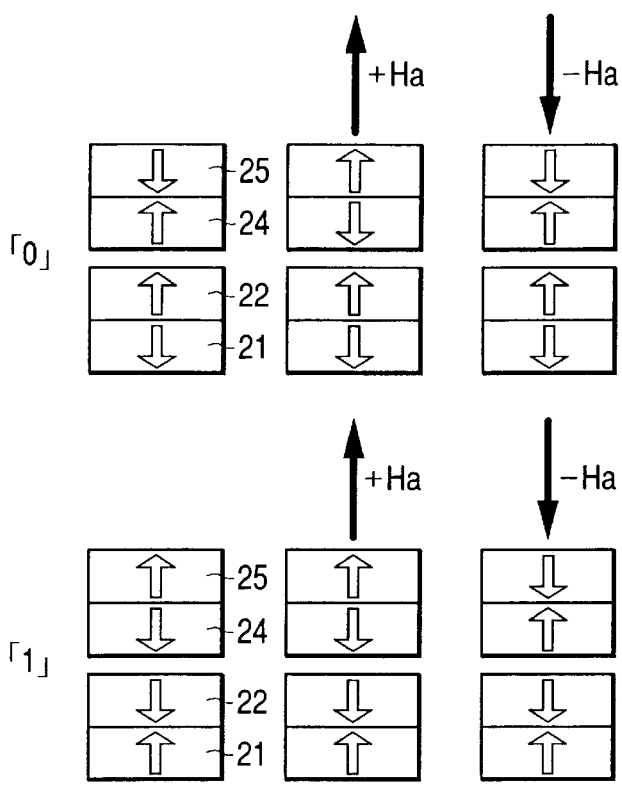
FIG. 7 illustrates detecting magnetic fields and magnetization directions at the time of detection in the magnetoresistance device of the present invention.

The magnetization of the detecting layer is reversed by applying a detecting magnetic field Ha as shown in FIG. 7. The magnitude of Ha is determined so that when Ha is applied the magnetization direction of the memory layer does not reverse and the magnetization direction of the detecting layer reverses.

Figure 8:
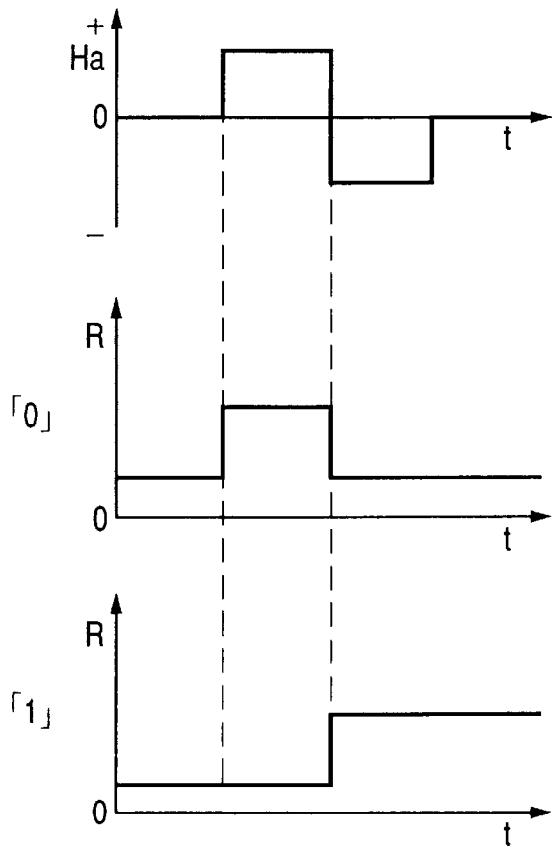
FIG. 8 illustrates a time chart showing a detecting magnetic field and changes in resistance differences.

FIG. 8 is a time chart showing the relationship between the detecting magnetic field Ha and magnetoresistance R. As shown in FIG. 7, Ha is first applied upward and then applied downward. Here, the magnetization direction where "0" has been recorded is regarded as the downward direction. It is seen that when "0" is recorded the magnetoresistance decreases before and after the Ha reverses, and when "1" is recorded the magnetoresistance increases on the contrary. In accordance with changes of this magnetoresistance device, recorded information can be detected non-destructively.

The present invention will be described below in greater detail by giving Examples.

The inside of a chamber was evacuated to $1 \times 10^{-5}$ Pa or less. Thereafter, on a glass substrate, films were formed by magnetron DC sputtering, as described in the following Examples and Comparative Examples.

EXAMPLE 1

A transition metal secondary-lattice predominantly magnetizable $Gd_{22}Fe_{78}$ film 20 nm thick as the first magnetic layer, an Fe film 1 nm thick as the second magnetic layer, a Cu film 6 nm thick as the non-magnetic layer, an Fe film 1 nm thick as the third magnetic layer, a transition metal secondary-lattice predominantly magnetizable $Gd_{20}Fe_{80}$ film 20 nm thick as the fourth magnetic layer and a Pt film 3 nm thick as the protective layer were formed in this order. During the film formation, Ar gas pressure was kept constant at 0.3 Pa. Also, as to film formation power, the magnetic layers were formed at 300 W, and the Cu and Pt layers at 150 W.

To the magnetoresistance device thus obtained, a magnetic field was applied in its film-plane vertical direction, and the magnetization curve was measured to find that the coercivity of the exchange-coupled film of the first magnetic layer and second magnetic layer was 250 Oe and the coercivity of the exchange-coupled film of the third magnetic layer and fourth magnetic layer was 100 Oe.

EXAMPLE 2

A rare-earth metal secondary-lattice predominantly magnetizable $Gd_{25}Fe_{75}$ film 20 nm thick as the first magnetic layer, an Fe film 1 nm thick as the second magnetic layer, a Cu film 6 nm thick as the non-magnetic layer, an Fe film 1 nm thick as the third magnetic layer, a rare-earth metal secondary-lattice predominantly magnetizable $Gd_{26}Fe_{74}$ film 20 nm thick as the fourth magnetic layer and a Pt film 3 nm thick as the protective layer were formed in this order under the same sputtering pressure and film formation powers as in Example 1.

To the magnetoresistance device thus obtained, a magnetic field was applied in its film-plane vertical direction, and the magnetization curve was measured to find that the coercivity of the exchange-coupled film of the first magnetic layer and second magnetic layer was 300 Oe and the coercivity of the exchange-coupled film of the third magnetic layer and fourth magnetic layer was 200 Oe.

EXAMPLE 3

A rare-earth metal secondary-lattice predominantly magnetizable $Gd_{27}Fe_{73}$ film 15 nm thick as the first magnetic layer, a $CoCr_{20}$ alloy film 2.5 nm thick as the second magnetic layer, a Cu film 3.5 nm thick as the non-magnetic layer, a $CoCr_{20}$ alloy film 1.5 nm thick as the third magnetic layer, a rare-earth metal secondary-lattice predominantly magnetizable $Gd_{27}Fe_{73}$ film 15 nm thick as the fourth magnetic layer and a Pt film 3 nm thick as the protective layer were formed in this order under the same sputtering pressure and film formation powers as in Example 1.

To the magnetoresistance device thus obtained, a magnetic field was applied in its film-plane vertical direction, and the magnetization curve was measured to find that the coercivity of the exchange-coupled film of the first magnetic layer and second magnetic layer was 570 Oe and the coercivity of the exchange-coupled film of the third magnetic layer and fourth magnetic layer was 440 Oe.

EXAMPLE 4

A rare-earth metal secondary-lattice predominantly magnetizable $Gd_{25}Fe_{75}$ film 20 nm thick as the first magnetic layer, an Fe film 1 nm thick as the second magnetic layer and an Al film 1.6 nm thick as the non-magnetic layer were laminated. Then, $O_2$ gas was introduced into the chamber so as to provide a pressure of 1 kPa, which was maintained for 1 hour to oxidize the Al layer. Thereafter, the inside of the chamber was again evacuated to $1 \times 10^{-5}$ Pa or less, and an Fe film 1 nm thick as the third magnetic layer, a rare-earth metal secondary-lattice predominantly magnetizable $Gd_{26}Fe_{74}$ film 20 nm thick as the fourth magnetic layer and a Pt film 3 nm thick as the protective layer were formed in this order. The magnetic layers and the protective layer were formed under the same sputtering pressure and film formation powers as in Example 1.

To the magnetoresistance device thus obtained, a magnetic field was applied in its film-plane vertical direction, and the magnetization curve was measured to find that the coercivity of the exchange-coupled film of the first magnetic layer and second magnetic layer was 300 Oe and the coercivity of the exchange-coupled film of the third magnetic layer and fourth magnetic layer was 200 Oe.

Comparative Example 1

A transition metal secondary-lattice predominantly magnetizable $Gd_{22}Fe_{78}$ film 10 nm thick as the memory layer, a Cu film 6 nm thick as the non-magnetic layer, a transition metal secondary-lattice predominantly magnetizable $Gd_{20}Fe_{80}$ film 10 nm thick as the detecting layer and a Pt film 3 nm thick as the protective layer were formed in this order under the same sputtering pressure and film formation powers as in Example 1.

To the magnetoresistance device thus obtained, a magnetic field was applied in its film-plane vertical direction, and the magnetization curve was measured to find that the coercivity of the memory layer was 150 Oe and the coercivity of the detecting layer was 110 Oe.

Comparative Example 2

A $CoCr_{20}$ alloy film 2.5 nm thick as the memory layer, a Cu film 3.5 nm thick as the non-magnetic layer, a $CoCr_{20}$ alloy film 1.5 nm thick as the detecting layer and a Pt film 3 nm thick as the protective layer were formed in this order under the same sputtering pressure (0.3 Pa) and film formation powers as in Example 1.

To the magnetoresistance device thus obtained, a magnetic field was applied in its film-plane vertical direction, and the magnetization curve was measured to find that any stepwise magnetization curve was obtainable. Also, magnetization-saturating magnetic field was in a value as large as 9.3 kOe.

Comparative Example 3

A rare-earth metal secondary-lattice predominantly magnetizable $Gd_{25}Fe_{75}$ film 10 nm thick as the memory layer and an Al film 1.6 nm thick as the non-magnetic layer were laminated. Then, $O_2$ gas was introduced into the chamber so as to provide a pressure of 1 kPa, which was maintained for 1 hour to oxidize the Al layer. Thereafter, the inside of the chamber was again evacuated to $1 \times 10^{-5}$ Pa or less, and a rare-earth metal secondary-lattice predominantly magnetizable $Gd_{26}Fe_{74}$ film 10 nm thick as the detecting layer and a Pt film 3 nm thick as the protective layer were formed in this order. The magnetic layers and the protective layer were formed under the same conditions as in Example 1.

To the magnetoresistance devices thus produced in Examples 1 to 4 and Comparative Examples 1 to 3, a magnetic field was applied in their film-plane vertical directions, and their magnetization curves were measured. As a result, both magnetic layers had a very small squareness ratio. Therefore magnetic properties were seen to have been deteriorated.

To the magnetoresistance devices produced as described above, a magnetic field was applied in their film-plane vertical directions, and the magnetoresistance ratio was measured by the four-terminal method. Results obtained are summarized in Table 1. The magnetoresistance ratio is standardized by regarding the value of Comparative Example 1 as 1.

TABLE 1

| Measured sample | Magnetoresistance ratio |
| --- | --- |
| Example 1 | 4.6 |
| Example 2 | 6.7 |
| Example 3 | 14.2 |
| Example 4 | 8.3 |
| Comparative Exampel 1 | 1.0 |
| Comparative Exampel 2 | no change |
| Comparative Exampel 3 | no change |

As shown in this table, in Examples 1 to 4, the devices are seen to have a sufficient magnetoresistance ratio. These magnetoresistance devices shown in Examples have the magnetic anisotropy in the film-plane normal direction. Hence, even with achievement of scale-down, there can be no increase in inverse magnetic fields and also no unstable magnetization.

As described above, the magnetoresistance device of the present invention has the following effects.

In the first place, since it has the magnetic anisotropy in the film-plane normal direction, it enables scale-down of devices.

Secondly, since the magnetization directions of the magnetic layers exchange-coupled with each other are set antiparallel, the magnetostatic coupling force can be made small. Thus, even when the non-magnetic layer has a small layer thickness, the magnetization directions of the second magnetic layer and third magnetic layer can readily be made to stand antiparallel, and a much higher magnetoresistance ratio can be materialized.

Thirdly, since a material less oxidizable than rare-earth metals and having a high magnetoresistance ratio is used, the magnetic layers do not deteriorate even when oxygen is contained in the non-magnetic layer, and a relatively high magnetoresistance ratio can be obtained.

What is claimed is:

1. A magnetoresistance device comprising:
    a multi-layer film having a first magnetic layer, a second magnetic layer, a non-magnetic layer, a third magnetic layer and a fourth magnetic layer which are superposed in this order,
    wherein the first magnetic layer is exchange-coupled with the second magnetic layer, forming a first exchange-coupled film, the third magnetic layer is exchange-coupled with the fourth magnetic layer, forming a second exchange-coupled film, magnetization directions of the first magnetic layer and the fourth magnetic layer are oriented perpendicular to the respective film planes, and the second magnetic layer and the third magnetic layer have a higher spin polarization ratio than the first magnetic layer and the fourth magnetic layer.

2. The magnetoresistance device according to claim 1, wherein the first magnetic layer and the fourth magnetic layer each comprise an alloy of a rare-earth metal and a transition metal.

3. The magnetoresistance device according to claim 1, wherein the second magnetic layer and the third magnetic layer each comprise a transition metal.

4. The magnetoresistance device according to claim 1, wherein the magnetization of the first magnetic layer and the second magnetic layer and the magnetization of the third magnetic layer and the fourth magnetic layer are antiparallel to each other.

5. The magnetoresistance device according to claim 4, wherein the magnetization of the first magnetic layer and the second magnetic layer and the magnetization of the third magnetic layer and the fourth magnetic layer reverse simultaneously in their respective desired applied magnetic fields.

6. The magnetoresistance device according to claim 1, wherein the non-magnetic layer comprises a conductor.

7. The magnetoresistance device according to claim 1, wherein the non-magnetic layer comprises an insulator.

8. The magnetoresistance device according to claim 1, wherein magnetizations of the second magnetic layer and the third magnetic layer are oriented in a direction perpendicular to a film plane by exchange-couplings with the first magnetic layer and the fourth magnetic layer, respectively.

9. A magnetoresistance device according to claim 1, wherein the first exchange-coupled film has a coercivity larger than that of the second exchange-coupled film.

10. A magnetoresistance device comprising:
    a multi-layer film having a first magnetic layer, a second magnetic layer, a non-magnetic layer, a third magnetic layer and a fourth magnetic layer which are superposed in this order,
    wherein the first magnetic layer is exchange-coupled with the second magnetic layer, the third magnetic layer is exchange-coupled with the fourth magnetic layer, the first magnetic layer and the fourth magnetic layer each comprise an alloy of a rare-earth metal and a transition metal, magnetization directions of the first magnetic layer and the fourth magnetic layer are oriented perpendicular to the respective film planes, the second magnetic layer and the third magnetic layer each comprise a transition metal and have a higher spin polarization ratio than the first magnetic layer and the fourth magnetic layer, and the non-magnetic layer comprises an insulator.

11. A magnetoresistance device comprising:
    a multi-layer film having a first magnetic layer, a second magnetic layer, a non-magnetic layer, a third magnetic layer and a fourth magnetic layer which are superposed in this order,
    wherein the magnetization direction of the second magnetic layer is perpendicular to the film plane by exchange-coupling with the first magnetic layer, the magnetization direction of the third magnetic layer is perpendicular to the film plane by exchange-coupling with the fourth magnetic layer, and the second magnetic layer and the third magnetic layer have a higher spin polarization ratio than the first magnetic layer and the fourth magnetic layer.

* * * * *

UNITED STATES PATENT AND TRADEMARK OFFICE
CERTIFICATE OF CORRECTION

PATENT NO. : 6,721,137 B1
DATED : April 13, 2004
INVENTOR(S) : Takashi Ikeda

It is certified that error appears in the above-identified patent and that said Letters Patent is hereby corrected as shown below:

Title page,
Item [56], References Cited, U.S. PATENT DOCUMENTS, insert:
-- 6,312,840 11/2001 Kumagai et al. --.

Column 2,
Line 54, "very" should be deleted.

Signed and Sealed this

Thirty-first Day of August, 2004

JON W. DUDAS
*Director of the United States Patent and Trademark Office*